US006972451B2

(12) United States Patent
Delpech et al.

(10) Patent No.: US 6,972,451 B2
(45) Date of Patent: Dec. 6, 2005

(54) TRENCH CAPACITOR IN A SUBSTRATE WITH TWO FLOATING ELECTRODES INDEPENDENT FROM THE SUBSTRATE

(75) Inventors: Philippe Delpech, Meylan (FR); Sébastien Cremer, Grenoble (FR); Michel Marty, Saint-Paul de Varces (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/437,633

(22) Filed: May 14, 2003

(65) Prior Publication Data

US 2003/0213989 A1 Nov. 20, 2003

(30) Foreign Application Priority Data

May 15, 2002 (FR) .................................. 02 05965

(51) Int. Cl.[7] ....................... H01L 27/108; H01L 21/20
(52) U.S. Cl. ....................... 257/301; 257/304; 257/305; 257/309; 257/535; 438/386; 438/243
(58) Field of Search .................................. 257/301–305, 257/307, 309–311, 535; 438/255, 386, 398, 438/665, 964, 243

(56) References Cited

U.S. PATENT DOCUMENTS

| 5,275,974 | A | * | 1/1994 | Ellul et al. .................. 438/386 |
| 5,976,928 | A | * | 11/1999 | Kirlin et al. ................. 438/240 |
| 6,103,586 | A | | 8/2000 | Chetlur et al. |
| 6,153,901 | A | * | 11/2000 | Higashi ...................... 257/301 |
| 6,362,012 | B1 | | 3/2002 | Chi et al. |
| 6,437,385 | B1 | * | 8/2002 | Bertin et al. ................. 257/301 |
| 2002/0025609 | A1 | | 2/2002 | Coursey |

OTHER PUBLICATIONS

French Search Report from French Patent Application 02/05965, filed May 15, 2002.

* cited by examiner

*Primary Examiner*—Minh-Loan Tran
(74) *Attorney, Agent, or Firm*—Lisa K. Jorgenson; James H. Morris; Wolf, Greenfield & Sacks, P.C.

(57) ABSTRACT

A capacitor formed in a substrate including a recess dug into a substrate; a first layer of a dielectric material covering the walls, the bottom and the edges of the recess; a second layer of a conductive material covering the first layer; a third layer of a conductive or insulating material filling the recess; trenches crossing the third layer; a fourth layer of a conductive material covering the walls, the bottoms as well as the intervals between these trenches and the edges thereof; a fifth layer of a dielectric material covering the fourth layer; and a sixth layer of a conductive material covering the fifth layer.

34 Claims, 5 Drawing Sheets

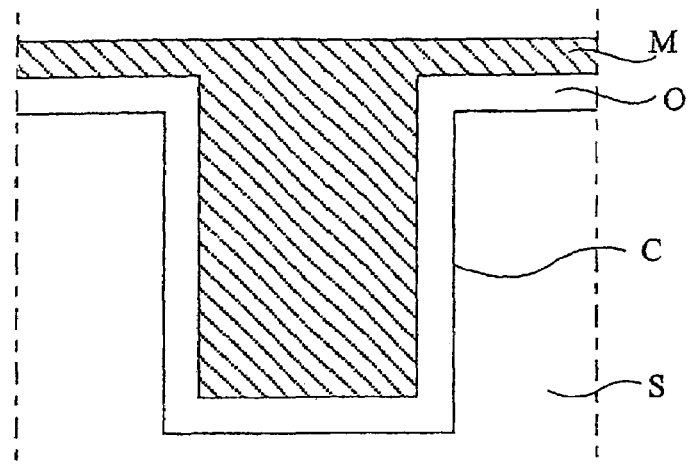
Fig 1
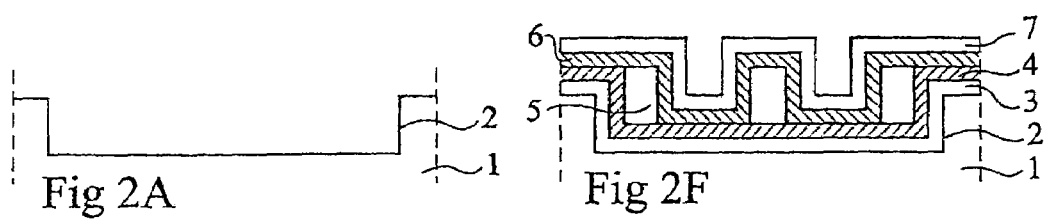
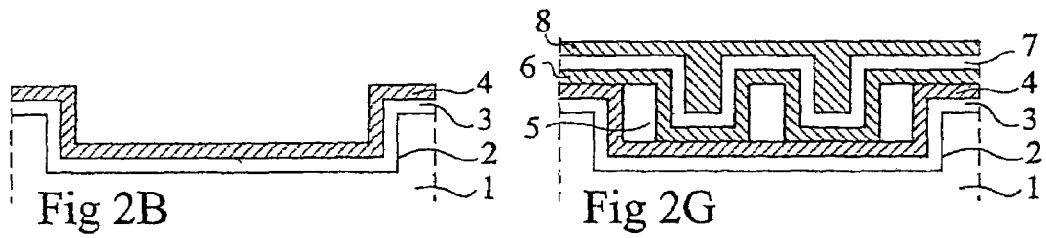
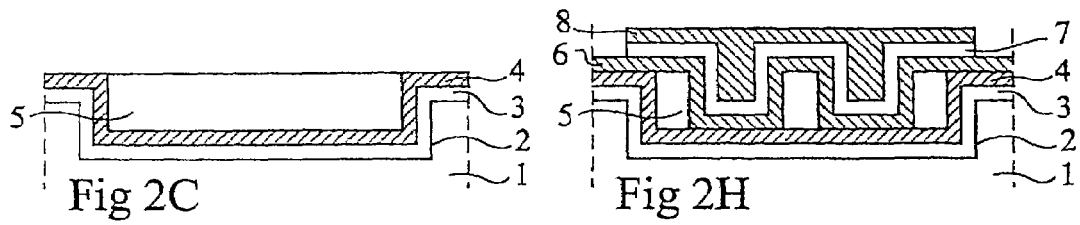
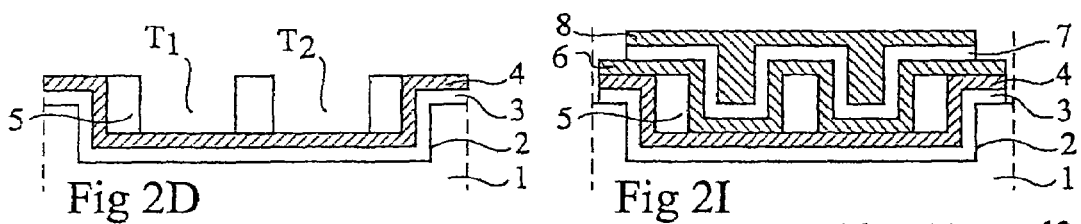
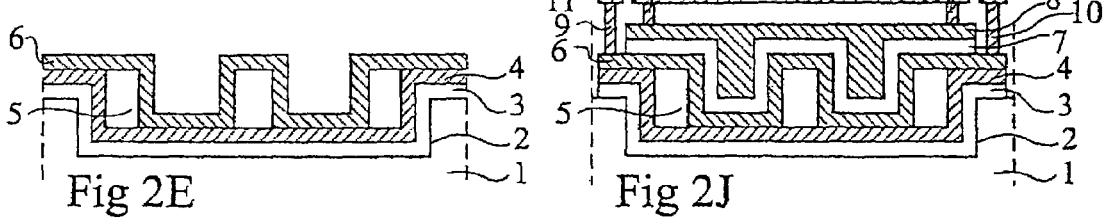

TRENCH CAPACITOR IN A SUBSTRATE WITH TWO FLOATING ELECTRODES INDEPENDENT FROM THE SUBSTRATE

BACKGROUND OF THE INVENTION

1. Field of the Invention

The present invention relates to the implementation, in integrated circuits, of high-capacitance capacitors, especially used as filtering, decoupling, and connecting capacitors.

2. Discussion of the Related Art

The capacitance value per surface area unit of a planar capacitor will be called hereafter the surface capacitance, and the capacitance value per unit of surface area projected on the substrate plane of a capacitor formed in three dimensions will be called the specific capacitance.

So-called "intermetallic" capacitors formed between metal layers formed above an integrated circuit to ensure interconnections are known. To form such capacitors, it is necessary to form a dielectric layer having the highest possible dielectric constant, and possibly an additional metal layer close to one of the metal layers used for interconnections.

A major disadvantage of such capacitors is that the surface area is very large and thus the cost of circuits using such capacitors is very high.

FIG. 1 is a cross-section view of another type of capacitor formed in a semiconductor substrate S which forms the first capacitor electrode. A recess C is dug into substrate S. The recess is covered with an oxide layer O, itself covered with a metal layer M which forms the second capacitor electrode. The main disadvantage of this solution is that the first electrode is connected to the substrate and accordingly its bias voltage is fixed (grounded). This type of capacitor is mainly used for decoupling.

SUMMARY OF THE INVENTION

The present invention aims at providing a method for forming capacitors having a specific capacitance greater than that of previously-mentioned capacitors.

Another object of the present invention is to provide such a method which enables obtaining capacitors with a reduced access resistance.

Another object of the present invention is to provide such a method which enables obtaining capacitors with two floating electrodes.

To achieve these and other objects, the present invention provides a method for manufacturing a capacitor in a substrate, comprising the steps of:

a) digging a recess into the substrate;
b) forming a first conformal layer of an insulating material;
c) forming a second conformal conductive layer;
d) forming a third layer of a conductive or insulating material filling up the recess;
e) digging trenches into the third layer, across the entire height thereof;
f) depositing a fourth layer of a conductive material;
g) forming a fifth layer of a dielectric material; and
h) depositing a sixth layer of a conductive material.

According to an embodiment of the present invention, the method comprises, between steps d) and e), the steps of depositing one or several layers of insulating materials corresponding to intermetallic insulating layers; and etching trenches in said one or several layers of insulating materials.

According to an embodiment of the present invention, the method comprises, between the steps of deposition and etch, the steps of depositing one or several layers of conductive materials corresponding to interconnection metal layers; and etching trenches in said one or several layers of conductive materials.

The present invention also provides a capacitor formed in a substrate comprising a recess dug into a substrate; a first layer of a dielectric material covering the walls, the bottom and the edges of the recess; a second layer of a conductive material covering the first layer; a third layer of a conductive or insulating material filling the recess; trenches crossing the third layer; a fourth layer of a conductive material covering the walls, the bottoms as well as the intervals between these trenches and the edges thereof; a fifth layer of a dielectric material covering the fourth layer; and a sixth layer of a conductive material covering the fifth layer.

According to an embodiment of the present invention, the capacitor comprises one or several layers of insulating materials corresponding to intermetallic insulating layers; and trenches crossing said one or several layers of insulating materials.

According to an embodiment of the present invention, the capacitor comprises one or several layers of conductive materials corresponding to metal interconnection layers; and trenches crossing said one or several layers of conductive materials.

The foregoing objects, features, and advantages of the present invention, will be discussed in detail in the following non-limiting description of specific embodiments in connection with the accompanying drawings.

BRIEF DESCRIPTION OF THE DRAWINGS

FIG. 1 is a partial cross-section view of a capacitor according to prior art;

FIGS. 2A to 2J are a succession of partial simplified cross-section views illustrating a method for forming a capacitor according to the present invention;

DETAILED DESCRIPTION

Figure 3:
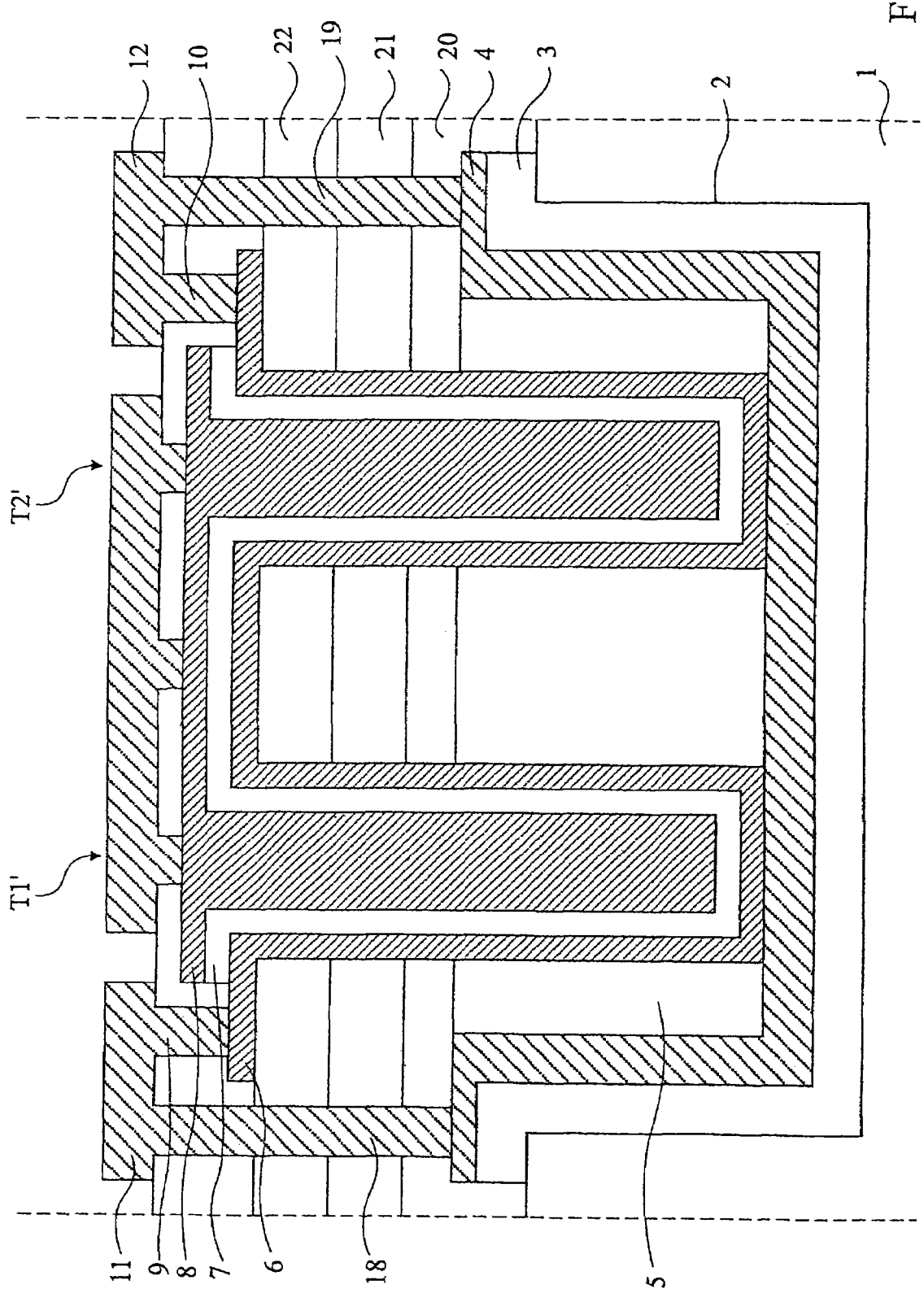
FIG. 3 is a simplified cross-section view of a capacitor according to an alternative embodiment of the present invention.

An embodiment of a capacitor according to the present invention is illustrated in FIGS. 2A to 2J which are partial simplified cross-section views of successive steps of the method according to the present invention. As conventional for the representation of integrated circuits, the various drawings are not drawn to scale.

As illustrated in FIG. 2A, a first step of the method according to the present invention comprises digging a recess 2 into a substrate 1. Conventionally, substrate 1 is a semiconductor material such as doped or undoped silicon. The substrate may also be formed with glass or any other material. Recess 2 is dug according to a conventional anisotropic etch method enabling obtaining a deep recess. As an example, the recess depth may be of approximately 20 micrometers.

As illustrated in FIG. 2B, the method carries on with the forming of an insulating layer 3 covering the bottom, the walls and the edges of recess 2. The insulating layer may be silicon dioxide (SiO2) obtained by thermal growth or by deposition according to a conventional process.

Insulating layer 3 is then covered with a conductive layer 4 deposited, for example, by chemical vapor deposition (CVD) or by physical vapor deposition (PVD). Conductive layer 4 may be a strongly conductive material such as copper, aluminum, tungsten or the like. In the case where the capacitor according to the presently described method is formed before other steps requiring a high-temperature anneal, it may be preferable to use materials such as polysilicon, which are unlikely to deteriorate and to diffuse into the rest of the structure.

Conductive layer 4 forms a portion of the first electrode of the capacitor according to the present invention. It should already be noted that there exists a stray capacitance between the first capacitor electrode and substrate 1. However, the value of this stray capacitance may be made negligible by adequately defining the thickness of insulating layer 3. To ease the evaluation of the value of this stray capacitance according to the shape and to the size of recess 2, it is preferable for insulating layer 3 to have a constant thickness. Similarly, the access resistance to the first capacitor electrode is a function of the thickness of conductive layer 4 which can easily be adjusted. It will here again be easier to calculate the access resistance if conductive layer 4 has a constant thickness.

As illustrated in FIG. 2C, the next step of the method according to the present invention comprises filling the recess, previously covered with layers 3 and 4, with a filling layer 5. To obtain a capacitor of maximum capacitance, the thickness of the filling layer will be provided to be at least equal to the recess height. Filling layer 5 may be made of an insulating, semiconductor, or possibly conductor material. In the case of an insulating material, it may be CVD-deposited SiO2. The advantage of using a conductive filling layer 5 is to make the access resistance negligible.

To obtain a constant thickness for filling layer 5 whatever the size of the recess, a chem-mech polishing (CMP) may be carried out. Preferably, filling layer 5 will be polished to reach the upper level of conductive layer 4. The use of dummy structures, such as substrate pillars left inside of the recess, may enable homogenizing the polishing and obtaining planar surfaces.

As illustrated in FIG. 2D, the next step comprises digging one or several trenches $T_1$, $T_2$, across the entire height of filling layer 5. A conventional anisotropic etch technique using, for example, a hard SiO$_2$ mask or resist may be used. In the case where filling layer 5 is formed of an insulating or semiconductor material, a selective etch method stopping on lower metal layer 4 may easily be provided. In the case where filling layer 5 is formed of a conductive material, an etch process that can stop before reaching insulating layer 3 will be used to avoid cutting conductive layer 4.

As illustrated in FIG. 2E, the method carries on with the deposition of a conductive layer 6 covering the walls, the edges and the bottom of trenches $T_1$, $T_2$. This deposition may be performed according to different techniques such as a low-pressure vapor chemical deposition (LPCVD) or an atomic layer chemical vapor deposition (ALCVD or ALD) or a metal-organic vapor deposition (MOCVD). The material deposited to form layer 6 will be chosen to be as conductive as possible to limit the access resistance, and if necessary resistant to high temperatures to limit deteriorations and the diffusion of layer 6. It may be polysilicon, titanium nitride (TiN), tantalum nitride (TaN), or any other conductive layer (Al, Cu, W, . . . ). Here again, the conformity of the deposition will ease the calculation of the access resistance.

As illustrated in FIG. 2F, the method carries on with a step of formation of a dielectric layer 7 covering the edges, the walls and the bottom of the trenches. Dielectric layer 7 may be formed by deposition according to the previously-mentioned techniques (LPCVD, ALCVD, ALD) to obtain an oxide such as $Al_2O_3$ or $Ta_2O_5$, or by thermal growth to obtain an oxide $SiO_2$ or an oxynitride ON. Here again, a conformal deposition and a thermally stable oxide are preferably chosen.

As illustrated in FIG. 2G, the method carries on with a deposition of a conductive layer 8 covering dielectric layer 7. The deposition will be performed according to one or several conventional techniques (CVD, LPCVD, ALCVD, ALD) and the chosen material(s) may be identical to that used for layer 6. Layer 8 forms the second capacitor electrode.

FIGS. 2H and 2I illustrate a possible shaping of layers 3, 4, 6, 7 and 8 according to conventional etch techniques. After etching, layers 3, 4, and 6 slightly cover the edges of the recess, and layers 7 and 8 are etched to expose a portion of the upper surface of layer 6 respectively to the left and to the right. Generally, this shaping step enables access to areas on the first electrode formed by layer 6, to be able to take contacts thereon.

FIG. 2J illustrates an example of contact making on the two capacitor electrodes. In this cross-section view, two vias 9 and 10 connected to conductive layer 6 can be seen on the recess edges. Vias 9 and 10 are respectively connected to metal areas 11 and 12 which form access terminals to the lower capacitor electrode. Similarly, a set of vias 13 and 14 connect conductive layer 8 to a metal area 17 which forms an access terminal to the upper capacitor electrode. More generally, the position and the number of contacts will be defined according to the desired access resistance at the capacitor electrodes. Openings may for example be provided in conductive layer 8 above the recess to increase the number of contacts with the lower electrode.

The order of the steps of the previously-described method may be modified. It may in particular be chosen to shape layers 3, 4, and 6 before depositing layers 7 and 8.

As a non-limiting example, the different elements of the capacitor according to the present invention may have the following characteristics:

insulating layer 1: $SiO_2$ obtained by thermal growth of a 500-nm thickness;
conductive layer 4: doped polysilicon, 100-nm thickness;
trenches of a minimum 0.3-$\mu$m width and separated by at least 0.3 $\mu$m;
conductive layer 6: polysilicon, 50-nm thickness;
dielectric layer 7: $SiO_2$, 40-nm thickness;
conductive layer 8: polysilicon, 60-nm thickness.

With the previously-described capacitor characteristics, it is possible to reach a specific capacitance from 30 to 100 nF/mm$^2$, to be compared with the surface capacitance of a planar intermetallic capacitor, formed with the same materials, from 2 to 5 nF/mm$^2$.

FIG. 3 is a simplified cross-section view of a capacitor according to an alternative embodiment of the present invention. The method for obtaining a capacitor uses all the steps of the method described in relation with FIGS. 2A to 2J, to which the steps of forming of successive insulating layers 20, 21, and 22 are added between the step of forming of filling layer 5 and the step of forming of conductive layer 6. Insulating layers 20, 21, 22 thus cover layer 5. The insulating layers will conventionally be intermetallic insulating layers of a conventional integrated circuit. Trenches $T_1'$ and $T_2'$ cross layer 5 like trenches $T_1$ and $T_2$, as well as insulating layers 20, 21, 22. The trench height is thus increased by the thickness of intermetallic insulating layers 20, 21, and 22 altogether and the specific capacitor capacitance increases. It may also be chosen to limit the recess depth and thus to simplify the step of digging the recess while keeping a sufficient specific capacitance. A shallower recess also enables generally decreasing the access resistance of the lower electrode. As an example, the capacitor of FIG. 3 comprises two vias 18 and 19 respectively connecting areas 11 and 12 to conductive layer 4, respectively on the left-hand and right-hand edges.

Figure 4:
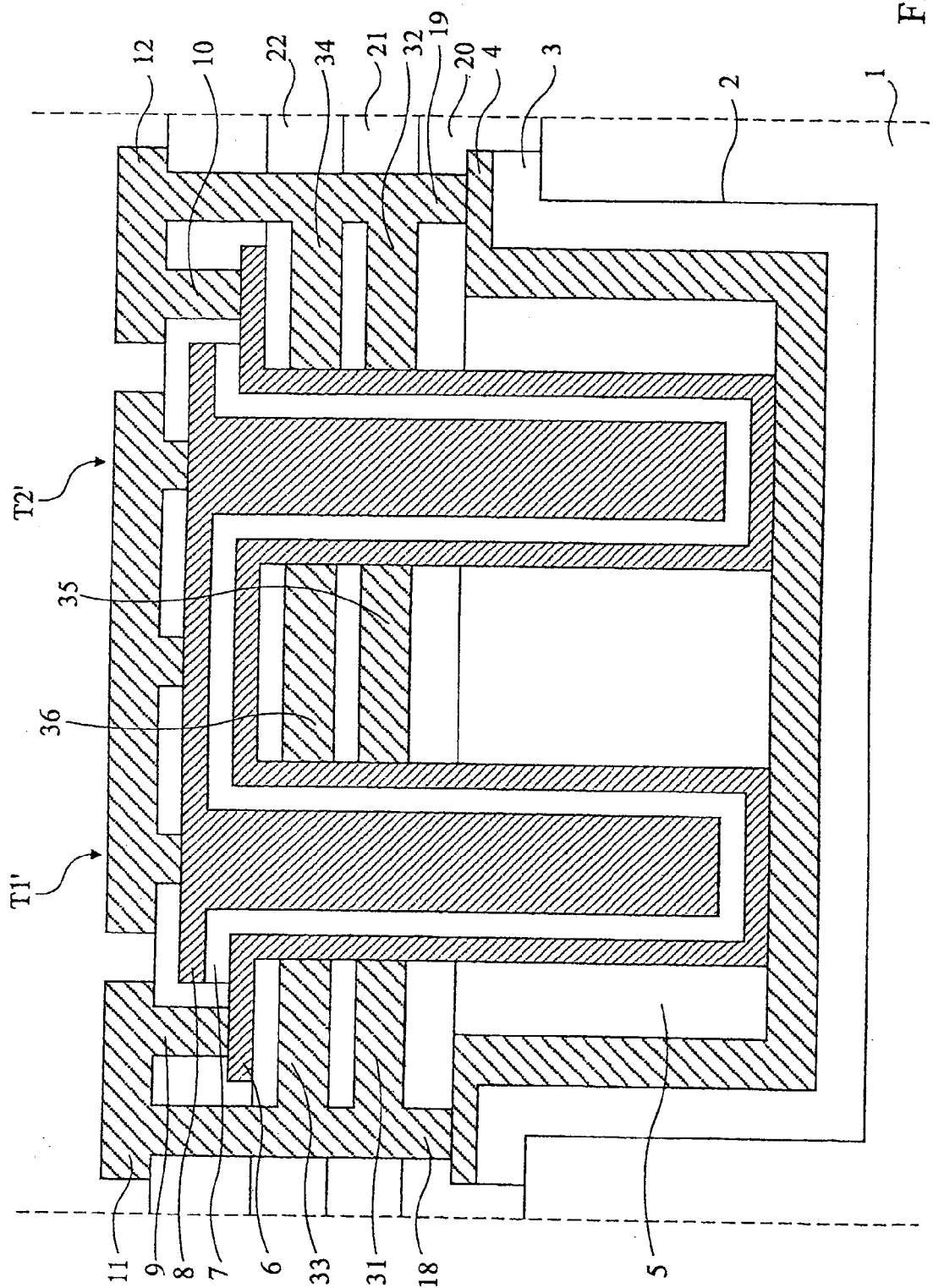
FIG. 4 is a simplified cross-section view of a capacitor according to another alternative embodiment of the present invention.

FIG. 4 is a simplified cross-section view of a capacitor according to a second alternative embodiment of the present invention. The forming method uses the method described in relation with FIG. 3, adding the forming of metal layers between the different steps of forming of the intermetallic dielectric layers of a standard integrated circuit. The capacitor shown in FIG. 4 thus comprises metal layers 31, 32, 33, and 34 connecting conductive layer 6 of the capacitor to the access terminals of the lower capacitor electrode. Metal layers 35 and 36 connect the walls of two successive trenches. Metal layers 31 to 36 significantly decrease the access resistance of the lower capacitor electrode. This second alternative embodiment, however, requires a trench etch process in several steps since it must be possible to etch different materials such as insulators, metals, dielectric materials or semiconductors.

Figure 5:
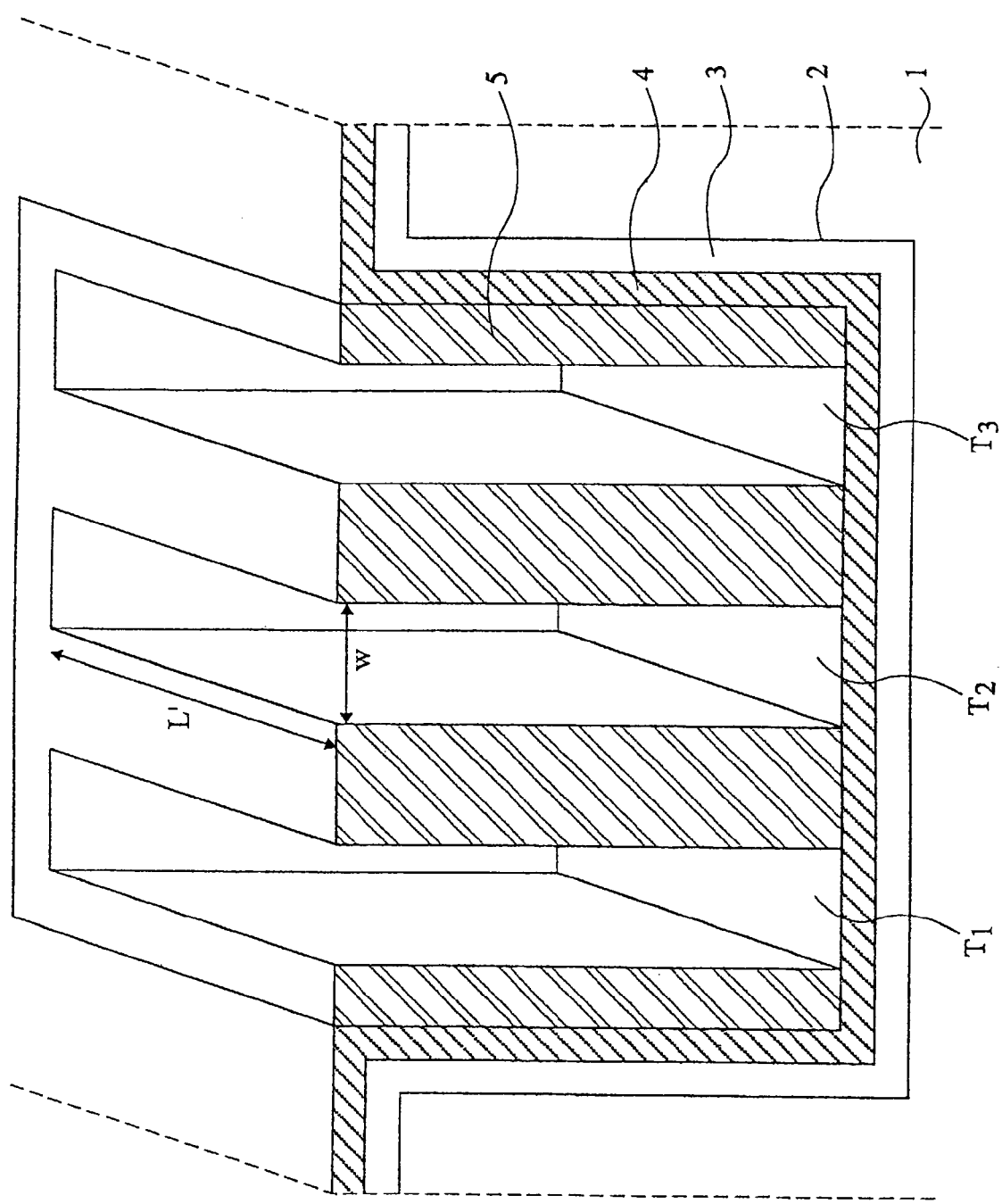
FIG. 5 is a perspective top view of an example of embodiment of a capacitor according to the present invention.
Figure 6:
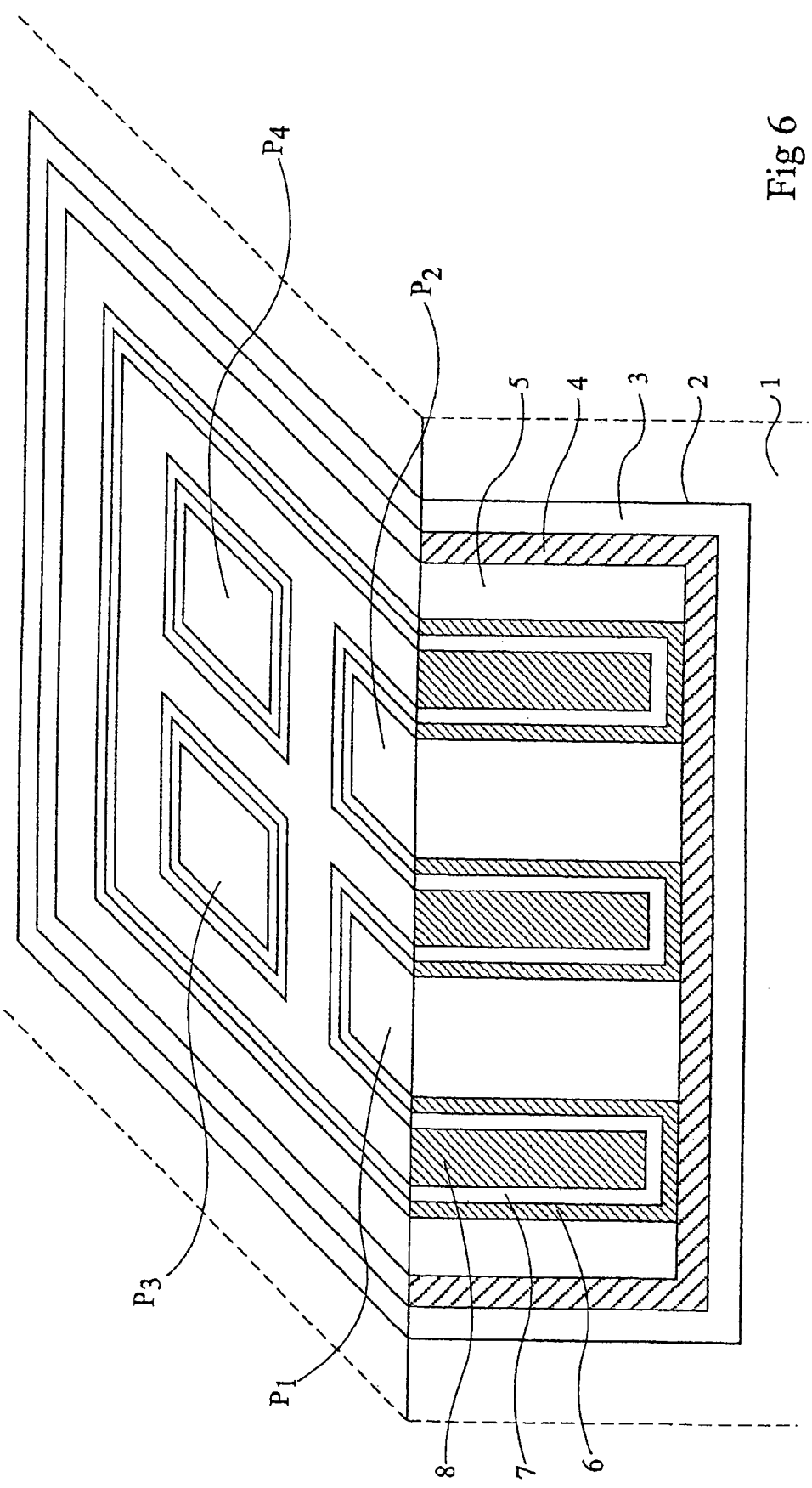
FIG. 6 is a perspective top vies of another example of embodiment of a capacitor according to the present invention.

FIGS. 5 and 6 are top perspective views of examples of the forming of a capacitor according to the present invention.

In FIG. 5, only the recess and layers 3 to 5 of the capacitor are shown. Recess 2 contains several parallel trenches of width W and of length L, L being greater than W. A portion only of length L' is shown in FIG. 5.

In FIG. 6, only the recess and layers 3 to 8 of the capacitor are shown. The horizontal portion in top view corresponds to a section at mid-height of recess 2. The etching of the trenches in the recess has been carried out to form in filling layer 5 a set of separate pylons $P_1$, $P_2$, $P_3$, and $P_4$ of rectangular base in the recess. The space between pylons $P_1$ to $P_4$ is covered by layers 6 to 8. The bottoms of each trench are interconnected. This example of embodiment enables improving or optimizing the specific capacitor capacitance.

However, it may be chosen to form capacitors according to the examples shown in FIG. 5 or 6 or any other form according in particular to the constraints of the manufacturing method used. Indeed, the trench etching and filling may be easier or more difficult according to the shape of the trenches, to their dimension, and to the spacing therebetween. According to the chosen form, a larger or smaller specific density may be obtained.

Further, those skilled in the art will easily define the optimal surface area of the recess providing the best specific capacitance, taking into account, in particular, the dishing phenomenon that may appear upon chem-mech polishing of the filling layer. In the case of a dishing, the resulting height of the trenches may be decreased towards the recess center and the capacitor capacitance may be thereby reduced. It may thus be envisaged to form a small recess containing a single trench. However, the maximum specific capacitance will a priori be obtained with recesses containing several trenches, since the required interval between recesses may lead to considerably reducing the general specific capacitance in the case where several recesses are used to form a single capacitor.

A major advantage of a capacitor according to the present invention is that its specific capacitance is very large.

Another advantage of a capacitor according to the present invention is that the electrode access resistance can be very small.

Another advantage of a capacitor according to the present invention is that the potential of each of the two electrodes can be chosen independently from the other circuit potentials.

Of course, the present invention is likely to have various alterations, modifications, and improvements which will readily occur to those skilled in the art. In particular, the previously-indicated numerical examples are linked to a specific manufacturing technology. They are by no means limiting. Further, those skilled in the art will be able to choose the shape of the trenches of a capacitor according to the present invention as well as the size and the number of used recesses. Those skilled in the art will also be able to choose and adapt the materials used and their dimension according to the constraints of a specific manufacturing technology (thermal stability, stress, etc.) and to the desired performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a capacitor in a substrate, comprising the steps of:
   a) digging a recess into the substrate;
   b) forming a first conformal layer of an insulating material;
   c) forming a second conformal conductive layer;
   d) forming a third layer of conductive or insulating material filling up the recess;
   e) digging trenches into the third layer, across the entire height thereof;
   f) depositing a fourth layer of a conductive material;
   g) forming a fifth layer of a dielectric material; and
   h) depositing a sixth layer of a conductive material.

2. The method of claim 1, comprising, between steps d) and e), the steps of:
   depositing one or several layers of insulating materials corresponding to intermetallic insulating layers; and
   etching trenches into said one or several layers of insulating materials.

3. The method of claim 2, comprising, between the steps of depositing and etching, the steps of:
   depositing one or several layers of conductive materials corresponding to interconnection metal layers; and
   etching trenches into said one or several layers of conductive materials.

4. A capacitor formed in a substrate comprising:
   a recess dug into a substrate;
   a first layer of a dielectric material covering the walls, the bottom and the edges of the recess;
   a second layer of a conductive material covering the first layer;

a third layer of a conductive or insulating material filling the recess;

trenches crossing the third layer;

a fourth layer of a conductive material covering the walls, the bottoms as well as the intervals between these trenches and the edges thereof;

a fifth layer of a dielectric material covering the fourth layer; and a sixth layer of a conductive material covering the fifth layer.

5. The capacitor of claim 4, comprising:

one or several layers of insulating materials corresponding to intermetallic insulating layers; and trenches crossing said one or several layers of insulating materials.

6. The capacitor of claim 5, comprising one or several layers of conductive materials corresponding to metal interconnection layers; and trenches crossing said one or several layers of conductive materials.

7. A capacitor formed in a substrate comprising a first surface, the capacitor comprising:

a recess in the first surface, the recess comprising a bottom and sides;

a first dielectric layer covering and conforming to the bottom and sides;

a first conductive layer covering and conforming to at least a portion of the first dielectric layer within the recess;

at least one region disposed within the recess and covering at least a portion of the first conductive layer;

at least one trench disposed within the recess;

a second conductive layer covering and conforming to the at least one region and contacting at least a portion of the first conductive layer; and a second dielectric layer covering and conforming to the second conductive layer within the recess.

8. The capacitor of claim 7, further comprising:

a first contact layer contacting at least one of the first conductive layer and the second conductive layer, wherein at least a portion of the first contact layer is disposed external to the recess.

9. The capacitor of claim 7, further comprising:

a third conductive layer covering at least a portion of the second dielectric layer.

10. The capacitor of claim 9, further comprising:

a first contact layer contacting the third conductive layer.

11. The capacitor of claim 7, wherein the at least one region is at least one pillar.

12. The capacitor of claim 11, wherein an upper surface of the at least one pillar lies in substantially a same plane as the first surface.

13. The capacitor of claim 7, wherein the at least one region is made of a dielectric material.

14. The capacitor of claim 7, wherein the at least one region is made of a conductive material.

15. The capacitor of claim 7, wherein a first electrode of the capacitor comprises the first conductive layer and the second conductive layer.

16. The capacitor of claim 15, wherein the first electrode of the capacitor further comprises the at least one region.

17. The capacitor of claim 7, wherein an access resistance of the second conductive layer has a value that is reduced by the first conductive layer from a value of the access resistance that would exist in an absence of the first conductive layer.

18. An array of capacitors, the array comprising at least one capacitor according to claim 7.

19. The capacitor of claim 7 wherein the trench further comprises a bottom; and wherein at least a portion of the second conductive layer is on the bottom of the trench.

20. The capacitor of claim 7 wherein the trench further comprises at least one side, wherein the at least one side comprises the at least one region.

21. The capacitor of claim 7 wherein the at least one trench comprises a depth approximately a height of the at least one region.

22. A method of making an integrated capacitor in a substrate having a first surface, the method comprising acts of:

forming a recess in the substrate, the recess comprising a bottom and sides;

forming a first dielectric layer covering and conforming to the bottom and sides;

forming a first conductive layer covering at least a portion of the first dielectric layer within the recess;

forming at least one region disposed within the recess and covering at least a portion of the first conductive layer;

forming at least one trench disposed within the recess;

forming a second conductive layer covering and conforming to the at least one region and contacting at least a portion of the first conductive layer; and forming a second dielectric layer covering and conforming to the second conductive layer.

23. The method of claim 22, wherein the act of forming the at least one region includes forming a third layer covering the first conductive layer and having a thickness that at least substantially fills the recess.

24. The method of claim 23, wherein the act of forming the at least one region further includes forming at least one trench in the third layer.

25. The method of claim 24, wherein a bottom surface of the trench is at least a portion of the first conductive layer.

26. The method of claim 24, wherein an upper surface of the trench lies in substantially a same plane as the first surface.

27. The method of claim 22, wherein the at least one region is made of a dielectric material.

28. The method of claim 22, wherein the at least one region is made of a conductive material.

29. The method of claim 22, further comprising:

forming a first contact layer contacting at least one of the first conductive layer and the second conductive layer, and at least partially disposed external to the recess.

30. The method of claim 22, further comprising:

forming a third conductive layer covering at least a portion of the second dielectric layer.

31. The method of claim 30, further comprising:

forming a first contact layer contacting the third conductive layer.

32. The method of claim 22 wherein the trench further comprises a bottom; and wherein at least a portion of the second conductive layer is formed on the bottom of the trench.

33. The method of claim 22 wherein the trench further comprises at least one side, wherein the at least one side comprises the at least one region.

34. The method of claim 22 wherein the at least one trench comprises a depth approximately a height of the at least one region.

* * * * *